United States Patent [19]

Fiori, Jr.

[11] Patent Number: 4,926,174
[45] Date of Patent: May 15, 1990

[54] DIGITAL VOLTMETER

[76] Inventor: David Fiori, Jr., 140 Dollington Rd., Yardley, Pa. 19067

[21] Appl. No.: 164,399

[22] Filed: Mar. 4, 1988

[51] Int. Cl.$^5$ .............................................. H03M 1/00
[52] U.S. Cl. .................................... 341/110; 341/127; 324/99 D
[58] Field of Search ............... 341/118, 126, 127, 132, 341/155, 158, 164, 110, 169, 152, 157, 144, 166, 167, 169; 324/99 D, 103 R, 103 P

[56] References Cited

U.S. PATENT DOCUMENTS

| | | | |
|---|---|---|---|
| 3,488,652 | 1/1970 | Huelsman | 341/164 |
| 4,097,860 | 6/1978 | Araseki et al. | 341/164 |
| 4,217,810 | 11/1978 | Purland | 324/99 D |
| 4,375,616 | 3/1983 | Keller et al. | 324/99 D |
| 4,709,224 | 11/1987 | Fiori | 341/152 |

Primary Examiner—Vit W. Miska
Assistant Examiner—Brian K. Young
Attorney, Agent, or Firm—Ratner & Prestia

[57] ABSTRACT

A digital voltmeter which converts an input signal having an amplitude to be measured into a digital signal from which a series of pulses is developed having a duty cycle which is proportional to the amplitude of the input signal. These pulses are supplied are supplied to a digital-to-analog converter which develops an analog signal having an amplitude proportional to the duty cycle of the pulses and is compared with the input signal to stabilize the digital signal at a value corresponding to the amplitude of the input signal.

39 Claims, 3 Drawing Sheets

DIGITAL VOLTMETER

TECHNICAL FIELD

The present invention relates, in general, to the measurement of electrical signals and, in particular, to a digital voltmeter which measures the amplitude of a signal by producing an indication of the duty cycle of a pulse-width modulated signal developed from the signal being measured.

BACKGROUND ART

*Digital Instrumentation,* by A. J. Bowens and published by McGraw Hill, describes at pages 223 through 226 circuitry which develops an indication of the amplitude of a signal being measured from the duty cycle of a series of pulses produced in response to the difference in amplitudes between the signal being measured and a signal having an amplitude dependent upon the duty cycle of the series of pulses. This amplitude measuring technique is identified as "delta pulse modulation."

The "delta-pulse modulation" circuitry described in *Digital Instrumentation* suffers from a serious shortcoming. In this circuitry, the signal representative of the duty cycle of the pulses and against which the amplitude of the input signal is compared is derived from a series of pulses which can have as many transitions in the generation of the series of pulses as there are elements of resolution. This is due to the fact that each clock signal from the clock oscillator which defines the resolution of the circuitry has the potential for causing the development of a pulse which contributes to the development of the indication of the amplitude of the signal being measured. As a result, errors due to imbalance and asymmetry in the rise and fall times of the pulse duty cycle are introduced for each such pulse. The cumulative effect can produce erroneous indications of the amplitude of the signal being measured.

DISCLOSURE OF THE INVENTION

The present invention provides a significant improvement over circuitry, such as the "delta-pulse modulation" circuitry described in *Digital Instrumentation,* in that there is a significant reduction in the transitions in the generation of the pulses from which the output indication is developed. As a result, the present invention develops a very accurate indication of the amplitude of the signal being measured.

A digital voltmeter, constructed in accordance with the present invention, includes means for supplying an input signal having an amplitude to be measured and means for supplying a digital reference signal representative of a fixed value. Also included are means responsive to the input signal for developing a digital signal representative of the amplitude of the input signal and pulse generating means responsive to the digital reference signal and the digital signal for developing an alternating series of oppositely directed first and second pulses. The first pulses have durations proportional to the fixed value of the digital reference signal plus the amplitude of the input signal and the second pulses have durations proportional to the fixed value of the digital reference signal minus the amplitude of the input signal. The digital voltmeter further includes a digital-to-analog converter responsive to the series of first and second pulses for (a) developing an analog signal having an amplitude proportional to the difference in durations between the first and the second pulses divided by the sum of the durations of the first and the second pulses, and (b) supplying the analog signal to the digital signal developing means to increase the value of the digital signal when the amplitude of the analog signal is less than the amplitude of the input signal and decrease the value of the digital signal when the amplitude of the analog signal is greater than the amplitude of the input signal.

BRIEF DESCRIPTION OF THE DRAWINGS

Referring to the drawings.

BEST MODE FOR CARRYING OUT THE INVENTION

A digital voltmeter, constructed in accordance with the present invention, provides a measurement of the amplitude of an input signal ($V_I$) when the amplitude of the input signal ($V_I$) is equal to the amplitude of the output signal ($V_X$) of a digital-to-analog converter arranged as an averaging differential integrator and functioning according to the following relationship:

$$V_x = \frac{T_1 - T_2}{T_1 - T_2} \tag{1}$$

$T_1$ and $T_2$ in equation (1) are the durations of an alternating series of oppositely directed pulses having a relationship to the amplitude of the input signal ($V_I$) which will be explained below. Applicant's copending application Ser. No. 925,022, filed Nov. 6, 1986 and entitled "Digital-to-Analog Converter," now U.S. Pat. No. 4,709,124 is directed to a preferred digital-to-analog converter which can be adapted for use in the present invention.

If in equation (1):

$$t_1 = M+N \text{ and } T_2 = M-N$$

where M and N are digital numbers, then equation (1), after substitution, becomes:

$$V_x = \frac{(M + N) - (M - N)}{(M + N) + (M - N)} \tag{2}$$

Simplifying equation (2):

$$V_x = \frac{N}{M} \tag{3}$$

If M is a constant, then the amplitude of the analog output signal ($V_X$) varies directly with the digital number N and when the amplitude of the analog output signal ($V_x$) is equal to the amplitude of the input signal ($V_I$), the digital number N provides a measure of the amplitude of the input signal ($V_I$).

Figure 1:
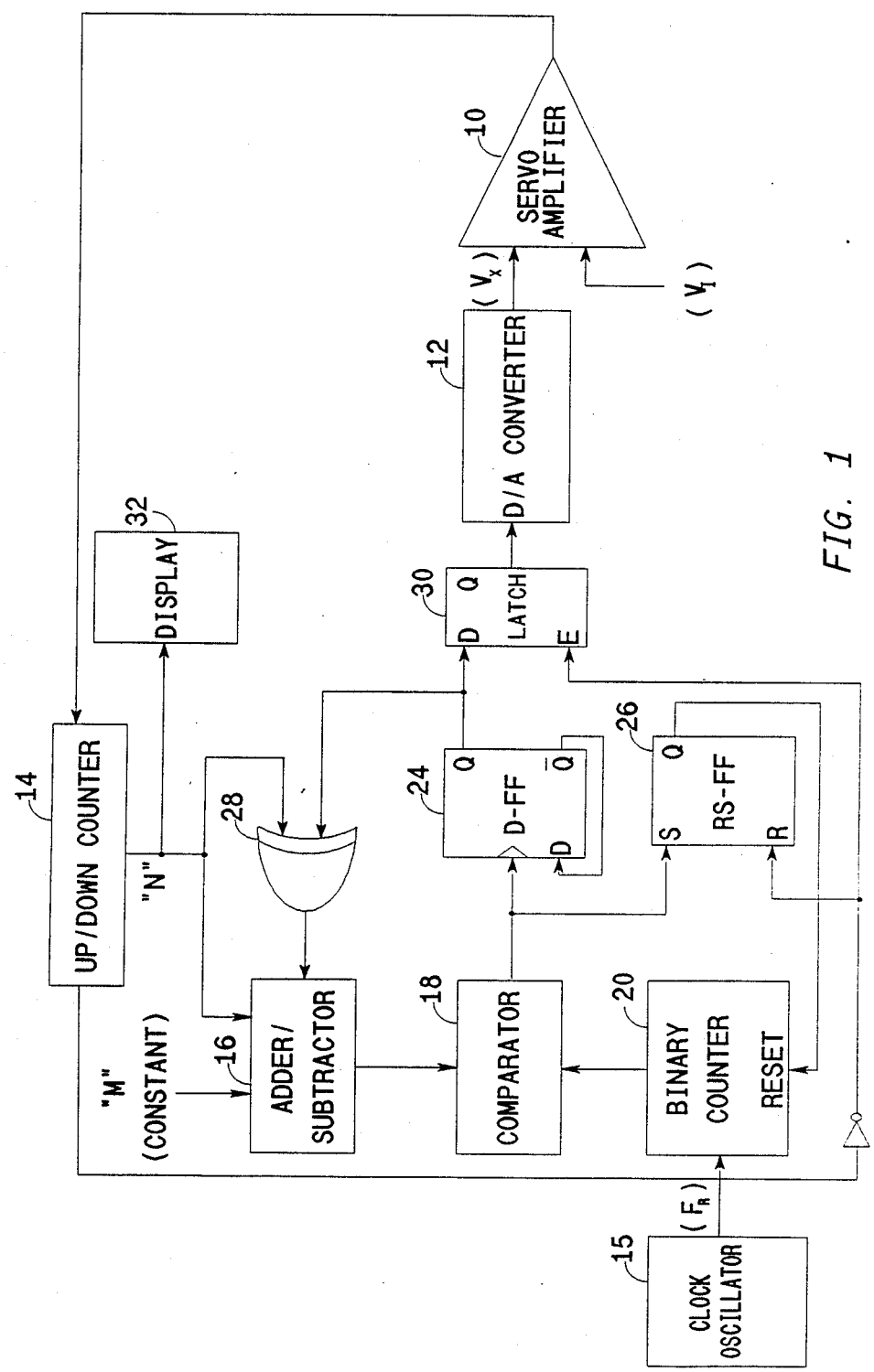
FIG. 1 is a block diagram of a first preferred embodiment of a digital voltmeter constructed in accordance with the present invention.

Referring to FIG. 1, which shows a first preferred embodiment of the present invention, an input signal ($V_I$) having an amplitude to be measured supplied to a servo amplifier 10. A second input signal ($V_X$) to servo amplifier 10 is supplied from the output of a digital-to-analog converter 12, such as the one to which the above-identified copending application is directed. Servo amplifier 10 is a high-gain unit which develops an output signal of one polarity when the amplitude of the input signal ($V_I$) is greater than the amplitude of the output signal ($V_X$) from digital-to-analog converter 12 and an output signal of opposite polarity when the amplitude of the input signal ($V_I$) is less than the amplitude of the output signal ($V_X$) from the digital-to-analog converter.

The output signal from servo amplifier 10 is supplied to an up/down counter 14 which counts clock pulses ($F_R$) supplied by a clock oscillator 15. Up/down counter 14 counts in one direction for a given polarity of the output signal from servo amplifier 10 and in an opposite direction when the output signal from the servo amplifier is of the opposite polarity. The combination of servo amplifier 10 and up/down counter 14 develops a digital signal representative of the amplitude of the input signal ($V_I$) and this digital signal corresponds to the digital number N identified above.

The digital signal (N) and a digital reference signal (M), representative of a fixed value, are supplied to an adder/subtracter 16 which, for a first time period, adds the digital signal (N) to the digital reference signal (M) to produce an (M+N) output and, for a second time period, subtracts the digital signal (N) from the digital reference signal (M) to produce an (M−N) output. The state of adder/subtracter 16 is controlled, in a manner to be described below, to alternately develop the (M+N) and (M−N) outputs.

The outputs from adder/subtracter 16 are supplied to a comparator 18 which also receives the output from a binary counter 20 to which the clock pulses ($F_R$) are supplied from clock oscillator 15. Comparator 18 develops an output which triggers a D−FF (flip-flop) 24 when the output of binary counter 20 is equal to the output of adder/subtracter 16. After binary counter 20 has counted a number of clock pulses ($F_R$) equal to the (M+N) output from adder/subtracter 16, comparator 18 develops a first trigger signal which changes the state of D−FF 24 to define a first pulse developed by the D−FF having a duration proportional to (M+N). The change in state of D−FF 24 changes the state of adder/subtracter 16, so that now it is conditioned to subtract the digital signal (N) from the digital reference signal (M). Comparator 18 also triggers a RS−FF (flip flop) 26 which, in turn, resets binary counter 20.

After binary counter 20 counts a new number of clock pulses ($F_R$) equal to the (M−N) output from adder/subtracter 16, comparator 18 develops a second trigger signal which changes the state of D−FF 24 to define a second pulse developed by the D−FF having a duration proportional to (M−N). This change in state of D−FF 24 changes the state of adder/subtracter 16 to return it to its initial state in which it is conditioned to add the digital signal (N) to the digital reference signal (M). Comparator 18 also triggers RS−FF 26 which, in turn, resets binary counter 20.

The state of adder/subtracter 16 is controlled by the output of a NOR gate 28 which responds to the sign of the digital signal (N) and changes in the state of the output of D−FF 24. As the output of D−FF 24 changes, the state of adder/subtracter 16 switches between adding and subtracting the two inputs to the adder/subtracter. The digital signal (N) is supplied to NOR gate 28 to accommodate both positive and negative input signals.

The alternating sequence just described keeps repeating to produce, at the output of D−FF 24, a series of oppositely directed pulses having durations proportional to the (M+N) and (M−N) outputs from adder/subtracter 16. The output from D−FF 24 passes through a latch 30 to digital-to-analog converter 12. Latch 30 serves to reduce the effects of propagation time delays. The transition time in changing from the (M+N) output to the (M−N) output is not necessarily the same as the transition time in changing from the (M−N) output to the (M+N) output. Latch 30 overcomes this problem by synchronizing the output from D−FF 24 with clock oscillator 15.

Digital-to-analog converter 12 develops an analog signal ($V_X$) having an amplitude proportional to the difference in durations between the (M+N) and (M−N) pulses divided by the sum of the durations of the (M+N) and (M−N) pulses. This corresponds to equation (1). So long as the amplitude of the analog signal ($V_X$) is less than the amplitude of the input signal ($V_I$), the output signal from servo amplifier 10 controls up/down counter 14 to continue to develop an increasing count of clock pulses ($F_R$) and the amplitude of the analog signal ($V_X$) increases. If the amplitude of the analog signal ($V_X$) becomes greater than the amplitude of the input signal ($V_I$), the polarity of the output signal of servo amplifier 10 reverses and controls up/down counter 14 to count clock pulses ($F_R$) in an opposite direction to decrease the count, thereby decreasing the amplitude of the analog signal ($V_X$). In this way, the output of up/down counter 14, namely the digital signal (N), stabilizes and represents the amplitude of the input signal ($V_I$). A suitable display device 32 provides an indication of the value of the digital signal (N).

As previously indicated, Applicant's copending application Ser. No. 925,022, now U.S. Pat. No. 4,709,224, is directed to a preferred digital-to-analog converter which can be adapted for use as digital-to-analog converter 12. The contents of this copending application are incorporated by reference as if fully set forth herein.

Figure 1A:
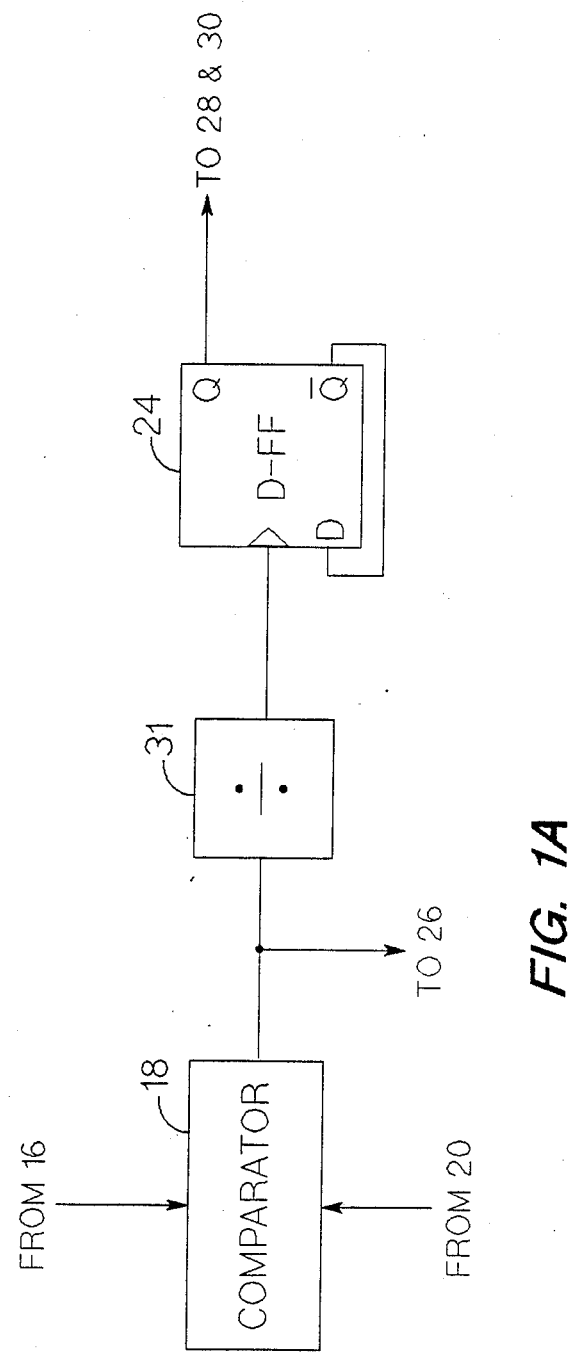
FIG. 1A is a block diagram of a modification which can be made to the FIG. 1 embodiment.

FIG. 1A illustrates one way of modifying the FIG. 1 embodiment of the present invention to adapt the digital-to-analog converter of application Ser. No. 925,022, now U.S. Pat. No. 4,705,224, for use in the present invention. This is accomplished by introducing a divider 31 between comparator 18 and D−FF 24. Adder/subtracter 16 in FIG. 1 corresponds to pulse source 10 in application Ser. No. 925,022 and comparator 18, divider 31 and D−FF 24 in FIG. 1A correspond to counter 12 in application Ser. No. 925,022, now U.S. Pat. No. 4,709,224.

With divider 31 set to divide by a factor of three, D−FF 24 changes state only after every third trigger signal developed by comparator 18. The division factor of divider 31 is selected to be three because the digital-to-analog converter of application Ser. No. 925,022 has, during each charge and discharge portion of its operation, a first charge (or discharge) period, a sample period, and a second charge (or discharge) period. With D−FF 24 changing state after only every third trigger signal developed by comparator 18, the state of adder/subtracter 16 is changed only after every third trigger signal developed by the comparator so that the (M+N) or (M−N) outputs from the adder/subtracter continue to be supplied until the D−FF 24 changes state. In this way, an (M+N) output is supplied during the first charge period of the digital-to-analog converter, during the charge sample period of the digital-to-analog converter, and during the second charge period of the digital-to-analog converter and an (M−N) output is supplied during the first discharge period of the digital-to-analog converter, during the discharge sample period of the digital-to-analog converter, and during the second discharge period of the digital-to-analog converter. As a result, the output of D−FF 24 still is a series of oppositely directed first and second pulses having durations proportional to (M+N) and (M−N), except that the durations of these pulses are three times longer than the durations of the pulses produced by the D−FF without the introduction of divider 31 between comparator 18 and the D−FF.

Figure 2:
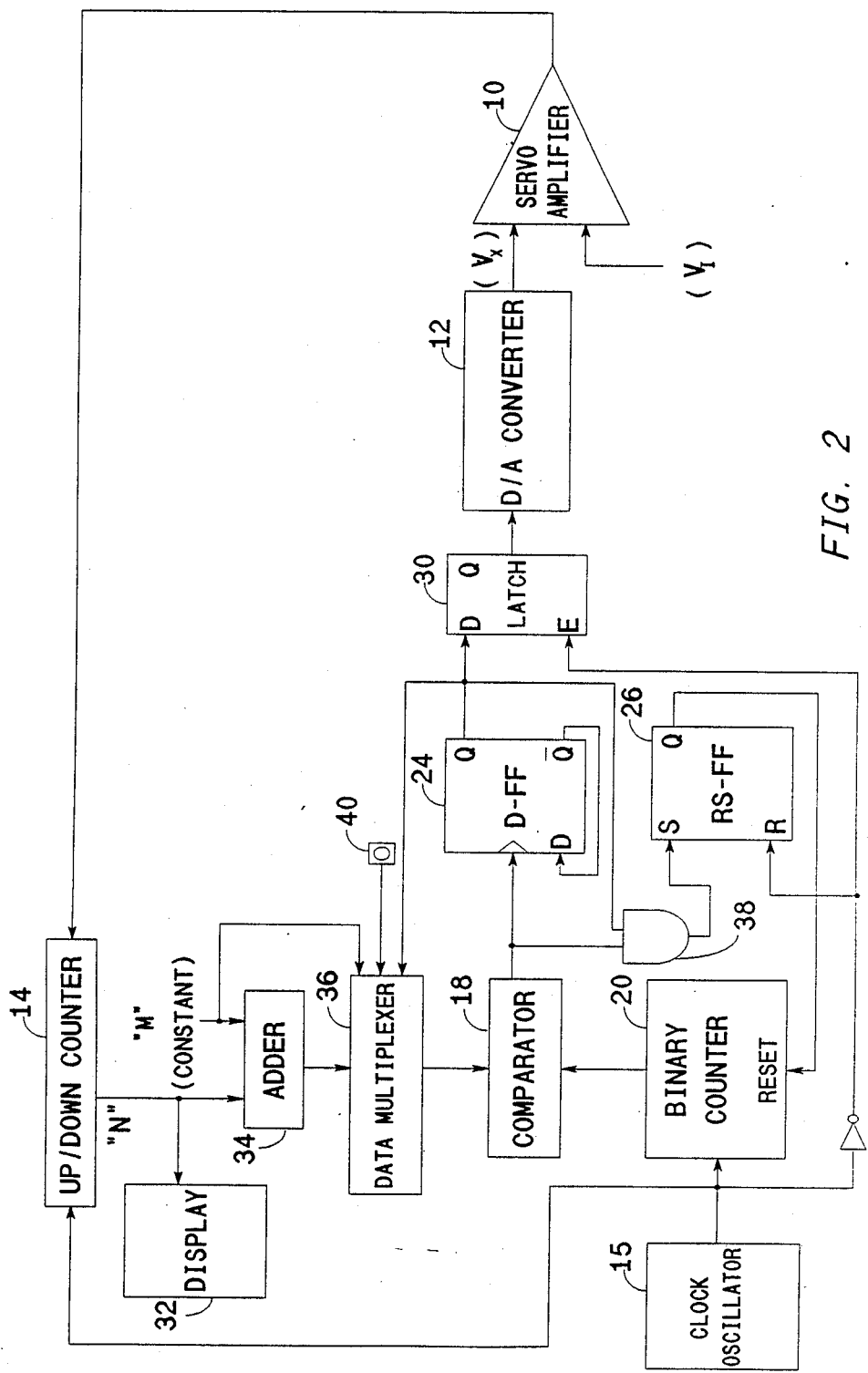
FIG. 2 is block diagram of a second preferred embodiment a digital voltmeter constructed in accordance with the present invention.

FIG. 2 shows a second preferred embodiment of digital voltmeter constructed in accordance with the present invention. The FIG. 2 embodiment operates in a generally similar manner to the FIG. 1 embodiment, except that in the FIG. 2 embodiment, the time intervals $T_1$ and $(T_1+T_2)$ are measured instead of the time intervals $T_1$ and $T_2$ as in the FIG. 1 embodiment. This is accomplished by not resetting binary counter 20 after the (M+N) count for time interval $T_1$ has been reached, but rather permitting the binary counter to continue counting until it reaches a total count equal to 2M for time interval $(T_1+T_2)$. As a result, time interval $T_2$ corresponds to an (M−N) count. Elements in FIG. 2 corresponding to elements in FIG. 1 have been given the same reference numerals.

As in the FIG. 1 embodiment, the output of up/down counter 14 is a digital signal (N) representative of the amplitude of the input signal $(V_I)$. The digital signal (N) and the digital reference signal (M) are supplied to an adder 34 which adds the digital signal to the digital reference signal to produce an (M+N) output. The output from adder 34 is supplied to a data multiplexer 36 which, for a first time period, passes the (M+N) output to comparator 18.

After binary counter 20 has counted a number of clock pulses $(F_R)$ equal to the (M+N) output from data multiplexer 36, comparator 18 develops a trigger signal which changes the state of D−FF 24 to define a first pulse developed by the D−FF having a duration proportional to (M+N). The changing state of D−FF 24 changes the state of multiplexer 36, so that it is conditioned to pass a 2M output to comparator 18.

The trigger signal developed by comparator 18 also is supplied to an AND circuit 38 which is also connected to the output of D−FF 24. Because AND circuit 38 requires two similar inputs, only every second trigger signal developed by comparator 18 causes RS−FF 26 to reset binary counter 20. As a result, binary counter 20 continues to count during time interval $T_2$ until it has counted during time interval $(T_1+T_2)$ a total number of clock pulses $(F_R)$ equal to 2M. When the total count of binary counter 20 is equal to 2M, comparator 18 develops a trigger signal which changes the state of D−FF 24 to define a second pulse developed by the D−FF having a duration proportional to (M−N). This change in state of D−FF 24 changes the state of data multiplexer 36 to return it to its initial state in which it is conditioned to pass the (M+N) output from adder 34 to comparator 18. This trigger signal from comparator 18 also is effective in resetting binary counter 20 because a second change in state of D−FF 24, along with the trigger signal, cause AND circuit 38 to condition RS−FF 26 to reset the binary counter.

The 2M output from data multiplexer 36 can be derived a number of ways. As shown in FIG. 2, the digital reference signal (M) is supplied to data multiplexer 36. By shifting this digital signal by one bit in wiring, as represented by reference numeral 40, the 2M output is derived during each time interval $T_2$ as a result of D−FF 24 conditioning data multiplexer 36 to pass the 2M output during these time intervals.

The remainder of the FIG. 2 embodiment of the present invention operates in the same manner as the FIG. 1 embodiment. Display device 32 provides an indication of the amplitude of the input signal $(V_I)$ which is developed from the digital signal (N). As with the FIG. 1 embodiment, the digital-to-analog converter of application Ser. No. 925,022, now U.S. Pat. No. 4,709,224, can be adapted for use in the FIG. 2 embodiment.

Figure 3:
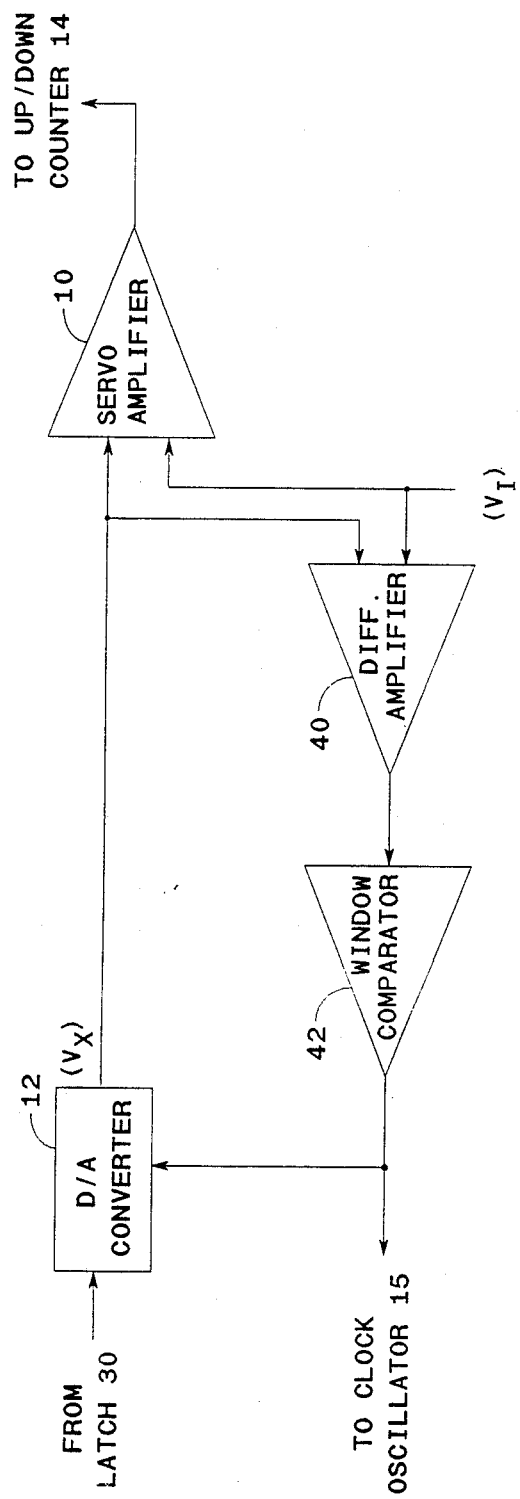
FIG. 3 is a block diagram of a modification which can be made to the FIGS. 1 and 2 embodiments.

FIG. 3 shows a modification which may be made to either the FIG. 1 or FIG. 2 embodiments of the present invention to overcome the introduction of errors which have more of an effect when operating such circuits at high speeds. FIG. 3 indicates how the added components would be connected to components in the FIG. 1 and FIG. 2 embodiments.

Initially, the circuitry of FIG. 3 is inoperative, so that the FIG. 1 and FIG. 2 embodiments operate at high speed, as previously described, to quickly reach a point where the amplitude of the analog signal $(V_X)$ from digital-to-analog convertor 12 is approaching the amplitude of the input signal $(V_I)$. At a prescribed point, the circuitry of FIG. 3 becomes operative and reduces the repetition rate of the clock pulses $(F_R)$ supplied by clock oscillator 15 to slow down the operation of the digital voltmeters shown in either FIG. 1 or FIG. 2. In other words, in each embodiment, the digital voltmeter operates at high speed to get within the range of the amplitude of the input signal $(V_I)$, during which time errors are of no concern, and then operates at a slower speed in actually obtaining an indication of the amplitude of the input signal $(V_I)$, at which time errors are of great concern.

The circuitry of FIG. 3 includes a differential amplifier 40 which is a low-gain unit that develops a signal representative of the difference in amplitudes between the input signal $(V_I)$ and the analog signal $(V_X)$. The output of differential amplifier 40 is supplied to a window comparator 42 which is set to produce an output signal when the difference signal developed by the differential amplifier falls within a prescribed range indicative of the amplitude of the analog signal $(V_X)$ approaching the amplitude of the input signal $(V_I)$ being measured. The output signal from window comparator 42 controls clock oscillator 15 to reduce the repetition rate of the clock oscillator. A window comparator is used rather than a level comparator to accommodate opposite polarity differences in the amplitudes between the input signal $(V_I)$ and the analog signal $(V_X)$.

It should be understood that, although the present invention has been described as a digital voltmeter, in the broadest sense, the present invention is directed to apparatus for converting a digital input signal to an analog output signal. The output signal from up/down counter 14 can be considered as a digital input signal representative of a variable value to downstream circuitry, so that the output signal from D/A converter 12 is an analog output signal corresponding to the digital input signal from the up/down counter. As a result, the circuitry between up/down counter 14 and servo amplifier 10 can receive and process other digital input signals besides one representative of the amplitude of the input signal ($V_I$) and produce analog output signals ($V_X$) representative of these other digital input signals.

The foregoing has set forth exemplary and preferred embodiments of the present invention. It will be understood, however, that various alternatives will occur to those of ordinary skill in the art without departure from the spirit and scope of the present invention.

I claim:

1. A digital voltmeter comprising:
   means for supplying an input signal having an amplitude to be measured;
   means for supplying a digital reference signal representative of a fixed value;
   means responsive to said input signal for developing a digital signal representative of the amplitude of said input signal;
   pulse generating means responsive to said digital reference signal and said digital signal for developing an alternating series of oppositely directed first and second pulses, said first pulses having durations proportional to the fixed value of said digital reference signal plus the amplitude of said input signal and said second pulses having durations proportional to the fixed value of said digital reference signal minus the amplitude of said input signal;
   and a digital-to-analog converter responsive to said series of first and second pulses for:
   (a) developing an analog signal having an amplitude proportional to the difference in durations between said first and said second pulses divided by the sum of the durations of said first and said second pulses, and
   (b) supplying said analog signal to said digital signal developing means to increase the value of said digital signal when the amplitude of said analog signal is less than the amplitude of said input signal and decrease the value of said digital signal when the amplitude of said analog signal is greater than the amplitude of said input signal.

2. A digital voltmeter according to claim 1 wherein said pulse generating means include:
   (a) means for counting first time periods proportional to the fixed value of said digital reference signals plus the amplitude of said input signal and second time periods proportional to the fixed value of said digital reference signal minus the amplitude of said input signal, and
   (b) a flip-flop responsive to said counting means for developing said first pulses during said first time periods and said second pulses during said second time periods.

3. A digital voltmeter according to claim 2 wherein said digital signal developing means include:
   (a) means for supplying a series of clock pulses,
   (b) means responsive to said input signal and said analog signal for developing:
      (1) a first count control signal of one polarity when the amplitude of said input signal is greater than the amplitude of said analog signal, and
      (2) a second count control signal of opposite polarity to said first count control signal when the amplitude of said input signal is less than the amplitude of said analog signal, and
   (c) an up/down counter responsive to said clock pulses and said first and said second count control signals for counting said clock pulses in an increasing manner in response to said first count control signal and in a decreasing manner in response to said second count control signal.

4. A digital voltmeter according to claim 3 wherein said time period counting means include:
   (a) an adder/subtracter responsive to said digital reference signal and said digital signal for adding the value of said digital signal to the value of said digital reference signal and for subtracting the value of said digital signal from the value of said digital reference signal,
   (b) a clock pulse counter for counting said clock pulses,
   (c) a comparator responsive to said adder/subtracter and said clock pulse counter for developing:
      (1) a first trigger signal for changing the state of said flip-flop when said clock pulse counter has counted a number of clock pulses equal to the sum of the values of said digital reference signal and said digital signal, and
      (2) a second trigger signal for changing the state of said flip-flop when said clock pulse counter has counted a number of clock pulses equal to the difference in the values of said digital reference signal and said digital signal,
   (d) means for resetting said clock pulse counter in response to each of said first and said second trigger signals, and
   (e) means responsive to said flip-flop for controlling said adder/subtracter to add the value of said digital signal to the value of said digital reference signal after the ends of said second pulses and to subtract the value of said digital signal from the value of said digital reference signal after the ends of said first pulses.

5. A digital voltmeter according to claim 1 further including means responsive to said input signal and said analog signal for:
   (a) determining when said input signal and said analog signal differ by less than a prescribed amount, and
   (b) controlling said pulse generating means to develop said alternating series of oppositely directed first and second pulses at a slower rate when said input signal and said analog signal differ by less than said prescribed amount than the rate at which said first and said second pulses are developed when said input signal and said analog signal differ by more than said prescribed amount.

6. A digital voltmeter according to claim 2 wherein said time period counting means include:
   (a) means for supplying a series of clock pulses,
   (b) an adder/subtracter responsive to said digital reference signal and said digital signal for adding the value of said digital signal to the value of said digital reference signal and for subtracting the value of said digital signal from the value of said digital reference signal,
   (c) a clock pulse counter for counting said clock pulses,
   (d) a comparator responsive to said adder/subtracter and said clock pulse counter for developing:
      (1) a first trigger signal when said clock pulse counter has counted a number of clock pulses equal to the sum of the values of said digital reference signal and said digital signal, and (2) a second trigger signal when said clock pulse counter has counted a number of clock pulses equal to the difference in the values of said digital reference signal and said digital signal, (e) means for resetting said clock pulse counter in response to each of said first and said second trigger signals, and (f) means responsive to said flip-flop for controlling said adder/subtracter to add the value of said digital signal to the value of said digital reference signal after the ends of said second pulses and to subtract the value of said digital signal from the value of said digital reference signal after the ends of said first pulses.

7. A digital voltmeter according to claim 6 further including:

(a) means responsive to said input signal and said analog signal for developing a difference signal representative of the difference in amplitude between said input signal and said analog signal, and (b) means responsive to said difference signal for reducing the rate of said clock pulses when said input signal and said analog signal differs by less than a prescribed amount.

8. A digital voltmeter according to claim 1 wherein said pulse generating means include:

(a) means for counting first time periods proportional to the fixed value of said digital reference signal plus the amplitude of said input signal and continuing the count of each first time period to a total counted time period proportional to twice the value of said digital reference signal, and (b) a flip flop responsive to said counting means for developing said first pulses during said first time periods and said second pulses during the time after said first time periods and until the end of said total counted time periods.

9. A digital voltmeter according to claim 8 wherein said digital signal developing means include:

(a) means for supplying a series of clock pulses, (b) means responsive to said input signal and said analog signal for developing:
(1) a first count control signal of one polarity when the amplitude of said input signal is greater than the amplitude of said analog signal, and
(2) a second count control signal of opposite polarity to said first count control signal when the amplitude of said input signal is less than the amplitude of said analog signal, and (c) an up/down counter responsive to said clock pulses and said first and said second count control signals for counting said clock pulses in an increasing manner in response to said first count control signal and in a decreasing manner in response to said second count control signal.

10. A digital voltmeter according to claim 9 wherein said time period counting means include:

(a) an adder responsive to said digital reference signal and said digital signal for developing an output signal representative of the sum of the values of said digital reference signal and said digital signal, (b) means for supplying a second digital reference signal representative of twice the value of said digital reference signal, (c) a clock pulse counter for counting said clock pulses, (d) a comparator alternately responsive first to said clock pulse counter and said output signal from said adder and second to said clock pulse counter and said second digital reference signal for alternately developing:
(1) a first trigger signal for changing the state of said flip-flop when said clock pulse counter has counted a number of clock pulses equal to the value of said output signal from said adder, and
(2) a second trigger signal for changing the state of said flip-flop when said clock pulse counter has counted a number of clock pulses equal to the value of said second digital reference signal, (e) means responsive to said second trigger signal for resetting said clock pulse counter, and (f) means responsive to said flip-flop for alternately passing to said comparator first said output signal from said adder and second said second digital reference signal.

11. A digital voltmeter according to claim 8 wherein said time period counting means include:

(a) an adder responsive to said digital reference signal and said digital signal for developing an output signal representative of the sum of the values of said digital reference signal and said digital signal, (b) means for supplying a second digital reference signal representative of twice the value of said digital reference signal, (c) a clock pulse counter for counting said clock pulses, (d) a comparator alternately responsive first to said clock pulse counter and said output signal from said adder and second to said clock pulse counter and said second digital reference signal for alternately developing:
(1) a first trigger signal for changing the state of said flip-flop when said clock pulse counter has counted a number of clock pulses equal to the value of said output signal from said adder, and
(2) a second trigger signal for changing the state of said flip-flop when said clock pulse counter has counted a number of clock pulses equal to the value of said second digital reference signal, (e) means responsive to said second trigger signal for resetting said clock pulse counter, and (f) means responsive to said flip-flop for alternately passing to said comparator first said output signal from said adder and second said second digital reference signal.

12. A digital voltmeter according to claim 11 further including:

(a) means responsive to said input signal and said analog signal for developing a difference signal representative of the difference in amplitude between said input signal and said analog signal, and (b) means responsive to said difference signal for reducing the rate of said clock pulses when said input signal and said analog signal differs by less than a prescribed amount.

13. A digital voltmeter according to claim 1 wherein said digital-to-analog converter includes:

(a) integrating means responsive to said series of first and second pulses for developing an integration signal composed of a rising portion developed from a pulse of said first series and a decaying portion developed from a pulse of said second series, (b) first switching means for selectively connecting said pulse generating means to said integrating means, (c) a capacitor, (d) second switching means for selectively connecting said integrating means to said capacitor, and (e) timing means for supplying (a) a first control signal to said first switching means to disconnect said pulse generating means from said integrating means and interrupt development of said integration signal, and (b) a second control signal to said second switching means to connect said integrating means to said capacitor to transfer the level of said integration signal to said capacitor during selected interruptions of the development of said integration signal.

14. A digital voltmeter according to claim 13 wherein said interruptions of the development of said integration signal are centered in said rising and decaying portions and the duration of interruption of the development of said integration signal during said rising portion is one-third of the duration of said pulse of said first series and the duration of interruption of the development of said integration signal during said decaying portion is one-third of the duration of said pulse of said second series.

15. A digital voltmeter according to claim 4 wherein said digital-to-analog converter includes:
(a) integrating means responsive to said series of first and second pulses for developing an integration signal composed of a rising portion developed from a pulse of said first series and a decaying portion developed from a pulse of said second series,
(b) first switching means for selectively connecting said flip-flop to said integrating means,
(c) a capacitor,
(d) second switching means for selectively connecting said integrating means to said capacitor, and
(e) timing means for supplying (a) a first control signal to said first switching means to disconnect said flip-flop from said integrating means and interrupt development of said integration signal, and (b) a second control signal to said second switching means to connect said integrating means to said capacitor to transfer the level of said integration signal to said capacitor during selected interruptions of the development of said integration signal.

16. A digital voltmeter according to claim 15 wherein said interruptions of the development of said integration signal are centered in said rising and decaying portions and the duration of interruption of the development of said integration signal during said rising portion is one-third of the duration of said pulse of said first series and the duration of interruption of the development of said integration signal during said decaying portion is one-third of the duration of said pulse of said second series.

17. A digital voltmeter according to claim 16 further including dividing means disposed between said comparator and said flip-flop for changing the state of said flip-flop only after every third trigger signal developed by said comparator.

18. A digital voltmeter according to claim 10 wherein said digital-to-analog converter includes:
(a) integrating means responsive to said series of first and second pulses for developing an integration signal composed of a rising portion developed from a pulse of said first series and a decaying portion developed from a pulse of said second series,
(b) first switching means for selectively connecting said flip flop to said integrating means,
(c) a capacitor,
(d) second switching means for selectively connecting said integrating means to said capacitor, and (e) timing means for supplying (a) a first control signal to said first switching means to disconnect said flip-flop from said integrating means and interrupt development of said integration signal, and (b) a second control signal to said second switching means to connect said integrating means to said capacitor to transfer the level of said integration signal to said capacitor during selected interruptions of the development of said integration signal.

19. A digital voltmeter according to claim 18 wherein said interruptions of the development of said integration signal are centered in said rising and decaying portions and the duration of interruption of the development of said integration signal during said rising portion is one-third of the duration of said pulse of said first series and the duration of interruption of the development of said integration signal during said decaying portion is one-third of the duration of said pulse of said second series.

20. A digital voltmeter according to claim 19 further including dividing means disposed between said comparator and said flip-flop for changing the state of said flip-flop only after every third trigger signal developed by said comparator.

21. Apparatus for converting a digital input signal to an analog output signal, said apparatus comprising:
means for supplying a digital input signal representative of a variable value;
means for supplying a digital reference signal representative of a fixed value;
pulse generating means responsive to said digital reference signal and said digital input signal for developing an alternating series of oppositely directed first and second pulses, said first pulses having durations proportional to the fixed value of said digital reference signal plus the value of said digital input signal and said second pulses having durations proportional to the fixed value of said digital reference signal minus the value of said digital input signal;
and a digital-to-analog converter responsive to said series of first and second pulses for developing an analog output signal having an amplitude proportional to the difference in durations between said first and said second pulses divided by the sum of the durations of said first and said second pulses.

22. Apparatus for converting a digital input signal to an analog output signal according to claim 21 wherein said pulse generating means include:
(a) means for counting first time periods proportional to the fixed value of said digital reference signals plus the value of said digital input signal and second time periods proportional to the fixed value of said digital reference signal minus the value of said digital input signal, and
(b) a flip-flop responsive to said counting means for developing said first pulses during said first time periods and said second pulses during said second time periods.

23. Apparatus for converting a digital input signal to an analog output signal according to claim 22 wherein said time period counting means include:
(a) an adder/subtracter responsive to said digital reference signal and said digital input signal for adding the value of said digital input signal to the value of said digital reference signal and for subtracting the value of said digital input signal from the value of said digital reference signal, (b) a clock pulse counter for counting said clock pulses, (c) a comparator responsive to said adder/subtracter and said clock pulse counter for developing:
  (1) a first trigger signal for changing the state of said flip-flop when said clock pulse counter has counted a number of clock pulses equal to the sum of the values of said digital reference signal and said digital input signal, and
  (2) a second trigger signal for changing the state of said flip-flop when said clock pulse counter has counted a number of clock pulses equal to the difference in the values of said digital reference signal and said digital input signal, (d) means for resetting said clock pulse counter in response to each of said first and said second trigger signals, and (e) means responsive to said flip-flop for controlling said adder/subtracter to add the value of said digital input signal to the value of said digital reference signal after the ends of said second pulses and to subtract the value of said digital input signal from the value of said digital reference signal after the ends of said first pulses.

24. Apparatus for converting a digital input signal to an analog output signal according to claim 21 wherein said pulse generating means include:

(a) means for counting first time periods proportional to the fixed value of said digital reference signal plus the value of said digital input signal and continuing the count of each first time period to a total counted time period proportional to twice the value of said digital reference signal, and (b) a flip-flop responsive to said counting means for developing said first pulses during said first time periods and said second pulses during the time after said first time periods and until the end of said total counted time periods.

25. Apparatus for converting a digital input signal to an analog output signal according to claim 24 wherein said time period counting means (a) an adder responsive to said digital reference signal and said digital input signal for developing an output signal representative of the sum of the values of said digital reference signal and said digital input signal, (b) means for supplying a second digital reference signal representative of twice the value of said digital reference signal, (c) a clock pulse counter for counting said clock pulses, (d) a comparator alternately responsive first to said clock pulse counter and said output signal from said adder and second to said clock pulse counter and said second digital reference signal for alternately developing:
  (1) a first trigger signal for changing the state of said flip-flop when said clock pulse counter has counted a number of clock pulses equal to the value of said output signal from said adder, and
  (2) a second trigger signal for changing the state of said flip-flop when said clock pulse counter has counted a number of clock pulses equal to the value of said second digital reference signal, (e) means responsive to said second trigger signal for resetting said clock pulse counter, and (f) means responsive to said flip-flop for alternately passing to said comparator first said output signal from said adder and second said second digital reference signal.

26. Apparatus for converting a digital input signal to an analog output signal according to claim 21 wherein said digital-to-analog converter includes:

(a) integrating means responsive to said series of first and second pulses for developing an integration signal composed of a rising portion developed from a pulse of said first series and a decaying portion developed from a pulse of said second series, (b) first switching means for selectively connecting said pulse generating means to said integrating means, (c) a capacitor, (d) second switching means for selectively connecting said integrating means to said capacitor, and (e) timing means for supplying (a) a first control signal to said first switching means to disconnect said pulse generating means from said integrating means and interrupt development of said integration signal, and (b) a second control signal to said second switching means to connect said integrating means to said capacitor to transfer the level of said integration signal to said capacitor during selected interruptions of the development of said integration signal.

27. Apparatus for converting a digital input signal to an analog output signal according to claim 26 wherein said interruptions of the development of said integration signal are centered in said rising and decaying portions and the duration of interruption of the development of said integration signal during said rising portion is one-third of the duration of said pulse of said first series and the duration of interruption of the development of said integration signal during said decaying portion is one-third of the duration of said pulse of said second series.

28. Apparatus for converting a digital input signal to an analog output signal according to claim 23 wherein said digital-to-analog converter includes:

(a) integrating means responsive to said series of first and second pulses for developing an integration signal composed of a rising portion developed from a pulse of said first series and a decaying portion developed from a pulse of said second series, (b) first switching means for selectively connecting said flip-flop to said integrating means, (c) a capacitor, (d) second switching means for selectively connecting said integrating means to said capacitor, and (e) timing means for supplying (a) a first control signal to said first switching means to disconnect said flip-flop from said integrating means and interrupt development of said integration signal, and (b) a second control signal to said second switching means to connect said integrating means to said capacitor to transfer the level of said integration signal to said capacitor during selected interruptions of the development of said integration signal.

29. Apparatus for converting a digital input signal to an analog output signal according to claim 28 wherein said interruptions of the development of said integration signal are centered in said rising and decaying portions and the duration of interruption of the development of said integration signal during said rising portion is one-third of the duration of said pulse of said first series and the duration of interruption of the development of said integration signal during said decaying portion is one-third of the duration of said pulse of said second series.

30. Apparatus for converting a digital input signal to an analog output signal according to claim 29 further including dividing means disposed between said comparator and said flip-flop for changing the state of said flip-flop only after every third trigger signal developed by said comparator.

31. Apparatus for converting a digital input signal to an analog output signal according to claim 25 wherein said digital-to-analog converter includes:
  (a) integrating means responsive to said series of first and second pulses for developing an integration signal composed of a rising portion developed from a pulse of said first series and a decaying portion developed from a pulse of said second series,
  (b) first switching means for selectively connecting said flip-flop to said integrating means,
  (c) a capacitor
  (d) second switching means for selectively connecting said integrating means to said capacitor, and
  (e) timing means for supplying (a) a first control signal to said first switching means to disconnect said flip-flop from said integrating means and interrupt development of said integration signal, and (b) a second control signal to said second switching means to connect said integrating means to said capacitor to transfer the level of said integration signal to said capacitor during selected interruptions of the development of said integration signal.

32. Apparatus for converting a digital input signal to an analog output signal according to claim 31 wherein said interruptions of the development of said integration signal are centered in said rising and decaying portions and the duration of interruption of the development of said integration signal during said rising portion is one-third of the duration of said pulse of said first series and the duration of interruption of the development of said integration signal during said decaying portion is one-third of the duration of said pulse of said second series.

33. Apparatus for converting a digital input signal to an analog output signal according to claim 32 further including dividing means disposed between said comparator and said flip flop for changing the state of said flip-flop only after every third trigger signal developed by said comparator.

34. A digital voltmeter according to claim 13 wherein said interruptions of the development of said integration signal are centered in said rising and decaying portions.

35. A digital voltmeter according to claim 15 wherein said interruptions of the development of said integration signal are centered in said rising and decaying portions.

36. A digital voltmeter according to claim 18 wherein said interruptions of the development of said integration signal are centered in said rising and decaying portions.

37. Apparatus for converting a digital input signal to an analog output signal according to claim 26 wherein said interruptions of the development of said integration signal are centered in said rising and decaying portions.

38. Apparatus for converting a digital input signal to an analog output signal according to claim 28 wherein said interruptions of the development of said integration signal are centered in said rising and decaying portions.

39. Apparatus for converting a digital input signal to an analog output signal according to claim 31 wherein said interruptions of the development said integration signal are centered in said rising and decaying portions.

* * * * *